United States Patent
Chi et al.

(10) Patent No.: US 10,476,533 B1
(45) Date of Patent: Nov. 12, 2019

(54) TRANSMIT AND RECEIVE SWITCH AND BROADBAND POWER AMPLIFIER MATCHING NETWORK FOR MULTI-BAND MILLIMETER-WAVE 5G COMMUNICATION

(71) Applicant: SPEEDLINK TECHNOLOGY INC., Cupertino, CA (US)

(72) Inventors: Taiyun Chi, Atlanta, GA (US); Hua Wang, Atlanta, GA (US); Thomas Chen, Atlanta, GA (US)

(73) Assignees: SPEEDLINK TECHNOLOGY INC., Cupertino, CA (US); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/965,694

(22) Filed: Apr. 27, 2018

(51) Int. Cl.
| | |
|---|---|
| *H04B 1/40* | (2015.01) |
| *H04B 1/00* | (2006.01) |
| *H03F 3/19* | (2006.01) |
| *H03F 3/24* | (2006.01) |
| *H03F 1/56* | (2006.01) |

(52) U.S. Cl.
CPC ............ *H04B 1/006* (2013.01); *H03F 1/565* (2013.01); *H03F 3/19* (2013.01); *H03F 3/245* (2013.01); *H03F 2200/294* (2013.01); *H03F 2200/318* (2013.01); *H03F 2200/423* (2013.01); *H03F 2200/451* (2013.01)

(58) Field of Classification Search
CPC . H04B 1/006; H04B 1/40; H04B 1/48; H04B 15/02; H04B 17/12; H04W 88/06; H03F 1/65; H03F 3/19; H03F 3/245; H01L 2223/6655; H01L 23/66
See application file for complete search history.

(56) References Cited

U.S. PATENT DOCUMENTS

| | | | |
|---|---|---|---|
| 2017/0019140 A1* | 1/2017 | Nick ...................... | H04B 1/006 |
| 2017/0180062 A1* | 6/2017 | Johansen ............... | H04B 17/12 |
| 2017/0331511 A1* | 11/2017 | Yoo ......................... | H04B 1/48 |

* cited by examiner

*Primary Examiner* — Thanh C Le
(74) *Attorney, Agent, or Firm* — Womble Bond Dickinson (US) LLP (57) ABSTRACT

According to one embodiment, a transmit/receive (T/R) switch includes a transmit switch, between a transmit port and an antenna port, a receive switch, between a receive port and the antenna port, a transmit inductor, coupled in parallel between the transmit switch the transmit port, and a receive inductor, coupled in parallel between the transmit switch the transmit port. The T/R switch can be co-designed with a power amplifier (PA) output matching circuit.

20 Claims, 8 Drawing Sheets

TRANSMIT AND RECEIVE SWITCH AND BROADBAND POWER AMPLIFIER MATCHING NETWORK FOR MULTI-BAND MILLIMETER-WAVE 5G COMMUNICATION

FIELD OF THE INVENTION

Embodiments of the present invention relate generally to wireless communication devices. More particularly, embodiments of the invention relate to a transmit/receive switch and a broadband power amplifier matching network of a communication device.

BACKGROUND

The 5G communication requires wide-band operation at the frequency range from 24 GHz to 43 GHz, necessitating a wide-band and efficient wireless transmitter. Conventionally, power amplifier (PA) and transmit/receive (T/R) switch are designed separately with a single standard 50Ω interface. The separation of these circuits can result in sacrificed transmitter bandwidth, output power, and efficiency.

Major transmitter specifications (for example, bandwidth, output power, and efficiency) are substantially governed or dominated by components located past the PA active transistors, for example, the PA output matching network and the T/R switch. Therefore, co-design of the PA output matching networks and T/R switch can provide a unique advantage and benefit to improve transmitter performance.

Furthermore, a T/R switch can beneficially have a greater degree of design freedom and improved impedance matching if the transmit and receive branches have separate matching inductors.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an electronic circuit for wireless communication includes a transmit/receive (T/R) switch. The T/R switch can include a transmit switch, between a transmit port and an antenna port; a receive switch, between a receive port and the antenna port; a transmit inductor, coupled in parallel between the transmit switch the transmit port; and a receive inductor, coupled in parallel between the transmit switch the transmit port.

According to some embodiments, an electronic circuit for wireless communication can be a co-designed circuit with a T/R switch and a power amplifier matching network. The matching network can include a first capacitor coupled, in parallel, to an input port of the matching network circuit; a broadband on-chip transformer coupled, in parallel, to the first capacitor; and a second capacitor coupled, in series, in between the broadband on-chip transformer and an output port of the matching network circuit, wherein the output port of the matching network circuit is coupled to the transmit port of the T/R switch.

According to some embodiments, a matching network circuit includes a first capacitor coupled, in parallel, to an input port of the matching network circuit; a broadband on-chip transformer coupled, in parallel, to the first capacitor, where the broadband on-chip transformer includes a primary winding and a secondary winding, where the secondary winding is a partial winding. The matching network circuit includes a second capacitor coupled, in series, in between the broadband on-chip transformer and an output port of the matching network circuit.

In one aspect, the primary and the secondary windings of the broadband on-chip transformer include planar octagonal windings. In another embodiment, the planar octagonal winding of the primary winding are electromagnetically coupled to the planar octagonal winding of the secondary windings along a planar axis. In another embodiment, the primary and the secondary windings are separated by a layer of dielectric. The primary and secondary windings may be disposed on different substrate layers as a part of an integrated circuit (IC).

In one embodiment, the partial winding of the secondary winding includes approximately 1.5 turns winding. In one embodiment, the primary winding is coupled to a power supply source to supply a bias voltage to a circuit of the input port. In one embodiment, the secondary winding includes at least two conductive layers.

According to another aspect, a two-stage power amplifier (PA) includes a first amplifier stage, a second amplifier stage, a first matching network circuit coupled in between the first amplifier stage and the second amplifier stage, and a second matching network circuit coupled to an output port of the second amplifier stage. The second matching network includes a first capacitor coupled, in parallel, to an input port of the second matching network circuit; a broadband on-chip transformer coupled, in parallel, to the first capacitor, where the broadband on-chip transformer includes a primary winding and a secondary winding, where the secondary winding is a partial winding. The primary and secondary windings may be disposed on different substrate layers as a part of an integrated circuit. The second matching network includes a second capacitor coupled, in series, in between the broadband on-chip transformer and an output port of the second matching network circuit.

According to another aspect, an RF frontend integrated circuit (IC) device includes a two-stage power amplifier (PA) to amplify a transmitted signal. The PA includes a first amplifier stage, a second amplifier stage, a first matching network circuit coupled in between the first amplifier stage and the second amplifier stage, and a second matching network circuit coupled to an output port of the second amplifier stage. The second matching network includes a first capacitor coupled, in parallel, to an input port of the second matching network circuit; a broadband on-chip transformer coupled, in parallel, to the first capacitor, where the broadband on-chip transformer includes a primary winding and a secondary winding, where the secondary winding is a partial winding. The primary and secondary windings may be disposed on different substrate layers as a part of an integrated circuit. The second matching network includes a second capacitor coupled, in series, in between the broadband on-chip transformer and an output port of the second matching network circuit.

Figure 1:
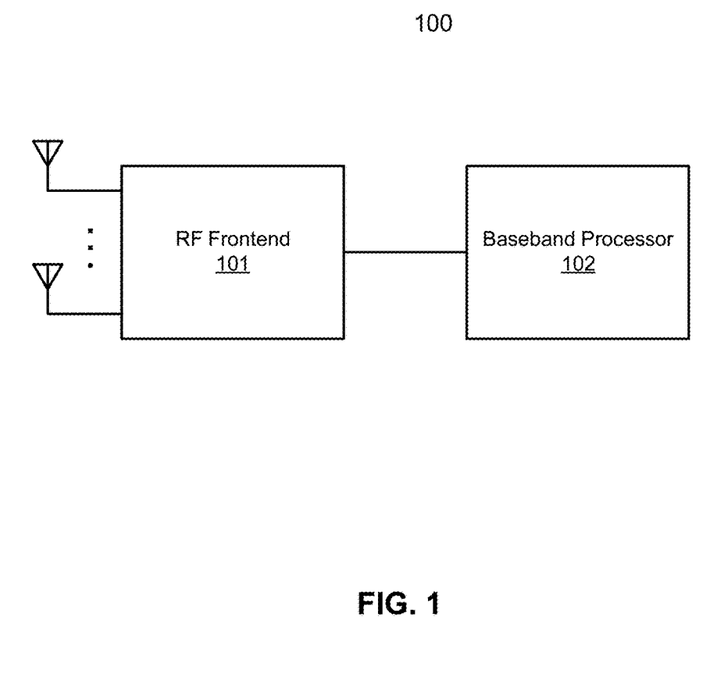
FIG. 1 is a block diagram illustrating an example of a wireless communication device according one embodiment.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes a frequency synthesizer coupled to the RF transceivers. The frequency synthesizer generates and provides a local oscillator (LO) signal to each of the RF transceivers to enable the RF transceiver to mix, modulate, and/or demodulate RF signals within a corresponding frequency band. The RF transceivers and the frequency synthesizer may be integrated within a single IC chip as a single RF frontend IC chip or package.

Figure 2:
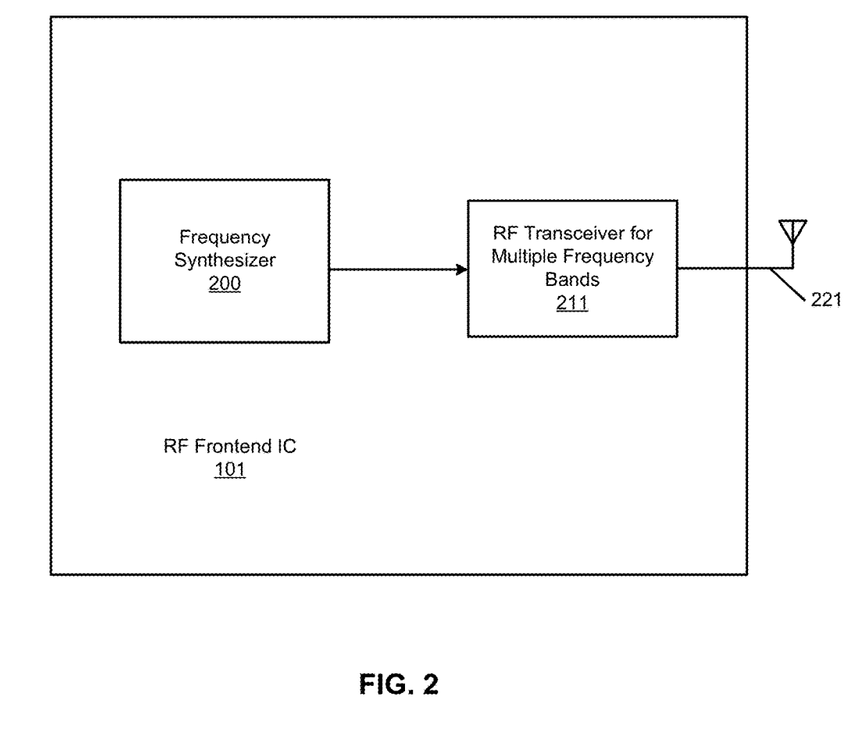
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, a frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
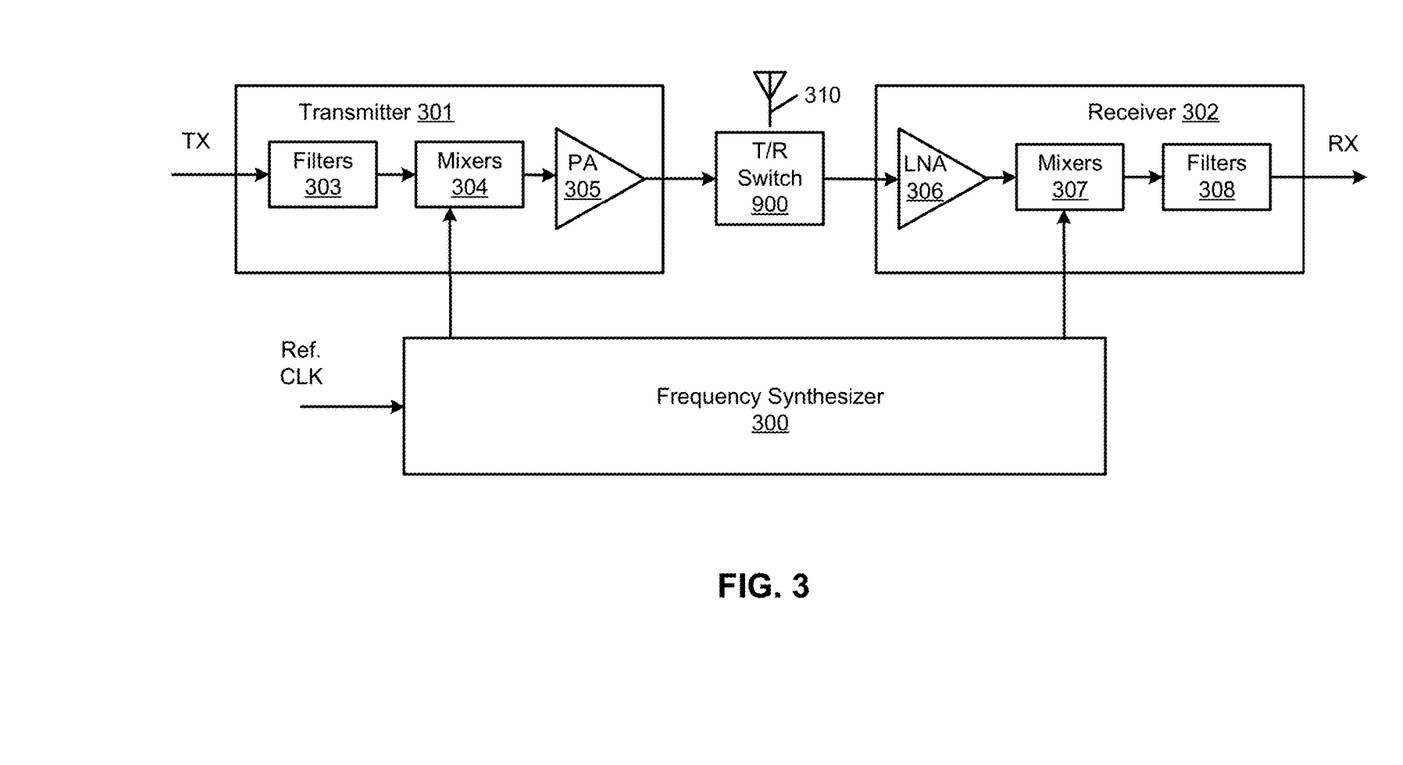
FIG. 3 is a block diagram illustrating an RF frontend integrated circuit according to one embodiment.

FIG. 3 is a block diagram illustrating an RF frontend integrated circuit according to one embodiment. Referring to FIG. 3, frequency synthesizer 300 may represent frequency synthesizer 200 as described above. In one embodiment, frequency synthesizer 300 is communicatively coupled to a broadband transmitter 301 and a broadband receiver 302, which may be a part of a transceiver such as transceiver 211. The broadband transmitter 301 transmits RF for a number of frequency bands.

In one embodiment, transmitter 301 includes filters 303, mixers 304, and a power amplifier 305. Filters 303 may be one or more low-pass (LP) filters that receives transmitting (TX) signals to be transmitted to a destination, where the TX signals may be provided from a baseband processor such as baseband processor 102. Mixers 301 (also referred to as up-convert mixers) are configured to mix and modulate the TX signals onto one or more carrier frequency signal based on local oscillator (LO) signals provided by frequency synthesizer 300. The modulated signals are then amplified by power amplifier 305 and the amplified signals are then transmitted to a remote receiver via antenna 310.

The RF frontend integrated circuit can include a receiver 302. Receiver 302 includes a low noise amplifier (LNA) 306, mixer(s) 307, and filter(s) 308. LNA 306 is to receive RF signals from a remote transmitter via antenna 310 and to amplify the received RF signals. The amplified RF signals are then demodulated by mixer(s) 307 (also referred to as a down-convert mixer) based on a LO signal provided by frequency synthesizer 300. The demodulated signals are then processed by filter(s) 308, which may be a low-pass filter. In one embodiment, transmitter 301 and receiver 302 share antenna 310 via a transmitting and receiving (T/R) switch 309. T/R switch 309 is configured to switch between transmitter 301 and receiver 302 to couple antenna 310 to either transmitter 301 or receiver 302 at a particular point in time. Although there is only one pair of transmitter and receiver shown, multiple pairs of transmitters and receivers may be coupled to frequency synthesizer 300, one for each of the multiple frequency bands.

Figure 4:
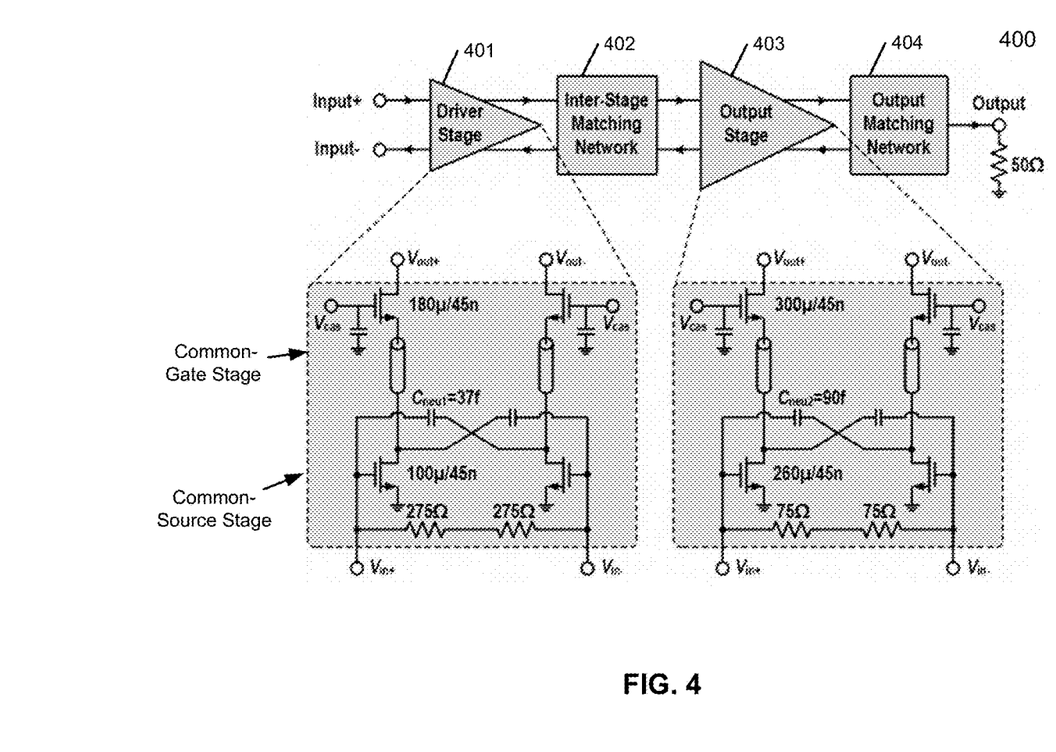
FIG. 4 is a block diagram illustrating an example of a power amplifier integrated circuit according to one embodiment.

FIG. 4 is a block diagram illustrating an example of a power amplifier (PA) integrated circuit according to one embodiment. Referring to FIG. 4, PA 400 can be PA 305 of FIG. 3. PA 400 can include driver stage 401, inter-stage matching network 402, output stage 403, and output matching network 404. Inter-stage matching network 402 and output matching network 404 can match impedances seen by driver stage 401 and output stage 403 to maximize a power transfer for PA 400. For example, inter-stage matching network 402 can match an input impedance and an output impedance to an impedance seen at the output port of driver stage 401 and an impedance seen at the input port of output stage 403, respectively, to maximize a power transfer from an input port of PA 400 to the output stage 403. Output matching network 404 can match the impedance seen from an output port of output stage 403 to maximize a power transfer from the output stage 403 to the output port of PA 400. Lastly, output matching network 404 can provide differential to single-ended conversion for a single-ended output port of PA 400.

Referring to FIG. 4, driver stage 401 and output stage 403 are amplifier stages of PA 400. In one embodiment, driver stage 401 and output stage 403 are differential cascode amplifier stages. A differential amplifier is an amplifier that amplifies a difference between two input voltages but suppresses any voltage common to the two inputs. Differential amplifiers offer common-mode noise rejection such as noise from nearby components and power supplies. A cascode amplifier is a two-stage amplifier (e.g., FETs or BJTs) that includes of a common-source (or a common-emitter for BJTs) stage feeding into a common-gate (or a common-base for BJTs) stage. Compared with single-stage amplifiers, cascode amplifiers have a higher input output isolation (i.e., reduces a leakage in reverse transmission from the output to the input ports as there is no direct coupling between the input and output ports), a higher input impedance, a higher output impedance, a higher gain, and a higher bandwidth. Here, driver stage 401 and output stage 403 include amplifiers that combine a differential topology and a cascode topology to achieve a large output swing, a wide bandwidth, with a high output power.

Transmit/Receive Switch

Figure 5:
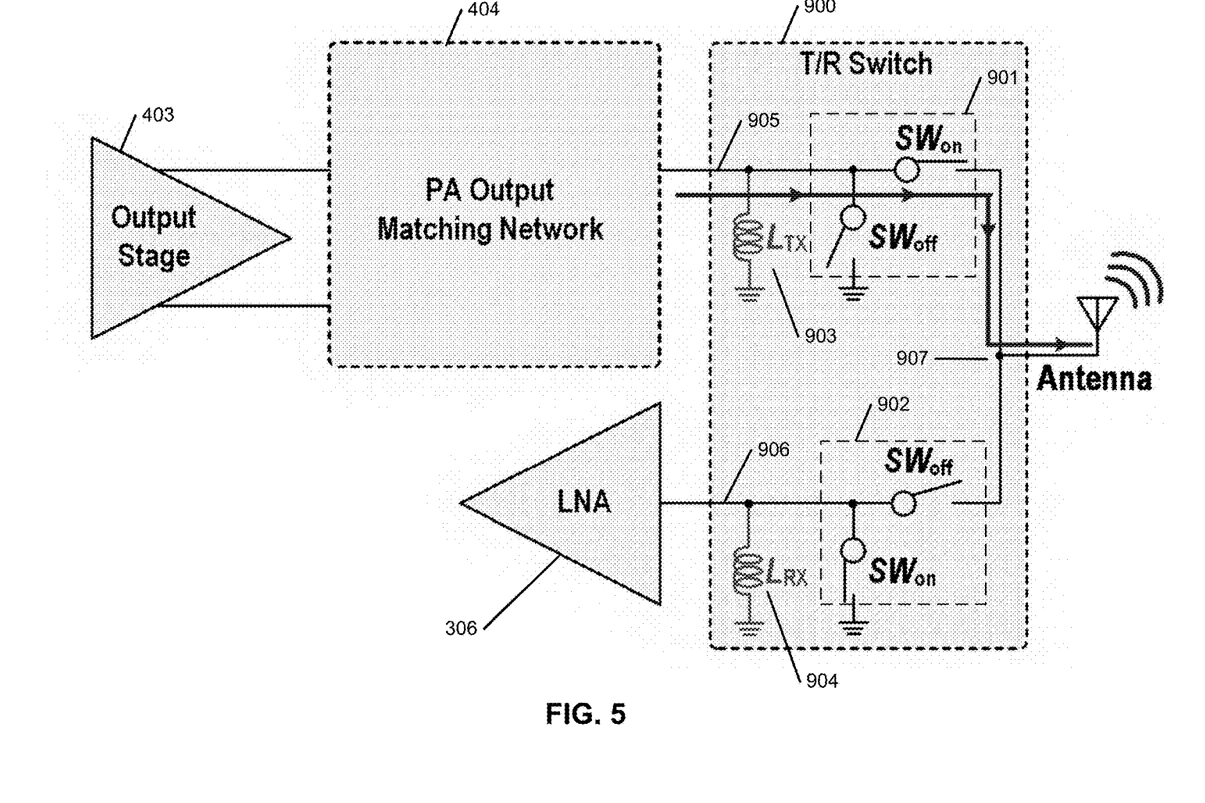
FIG. 5 shows a PA output matching network and a T/R switch according to one embodiment.

Referring now to FIG. 5, a transmit inductor $L_{TX}$ 903 can be coupled in parallel between the transmit switch 901 and the transmit port 905. Similarly, a receive inductor $L_{RX}$ 904 can be coupled in parallel between the receive switch 902 and the receive port 906.

The transmit switch 901 and the receive switch 902 can each have two poles, operating in sync, such that when a first pole of the transmit switch is on/closed, thereby connecting the output stage to the antenna, a first pole of the receive switch is off/open, thereby disconnecting the LNA from the antenna. Simultaneously, a second pole of the transmit switch is off/open, and a second pole of the receive switch is on/closed, thereby grounding the input to the LNA.

Figure 9:
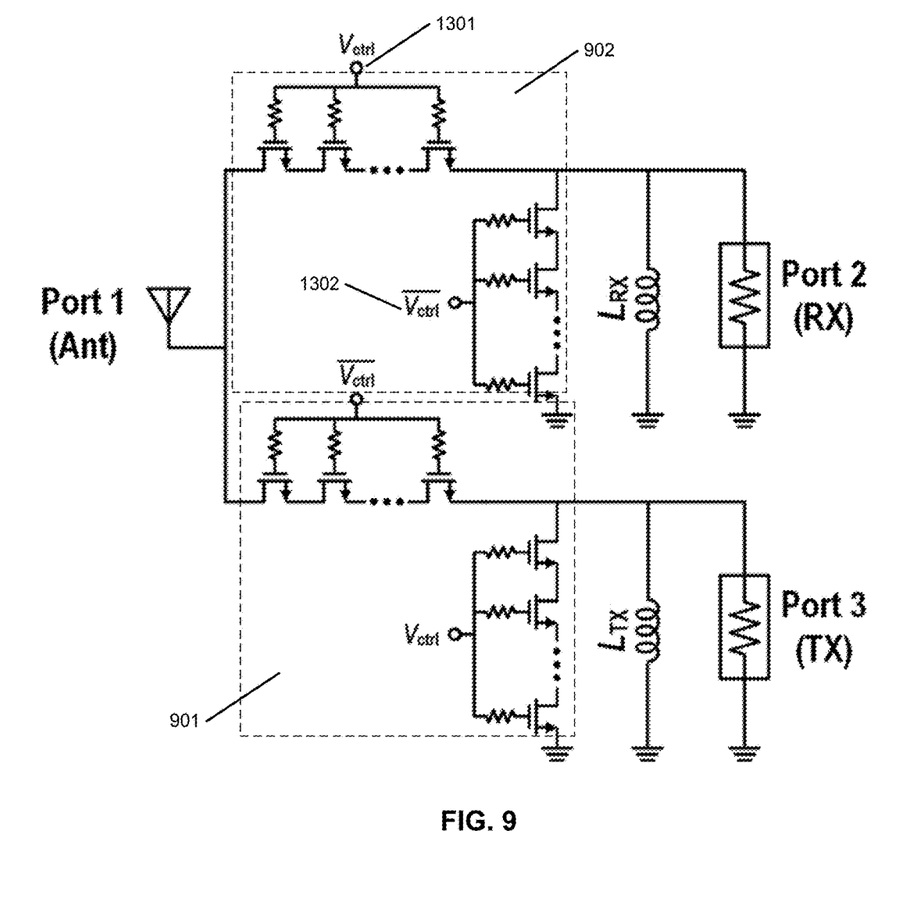
FIG. 9 shows an embodiment of the T/R switch.

In one embodiment, as shown in FIG. 9, the poles of the transmit and receive switches 901 and 902 each comprise one or more mosfets, having control inputs that are alternatingly synced by $V_{ctrl}$ 1301 and inverse $V_{ctrl}$ 1302 to control the poles as described above.

Beneficially, $L_{TX}$ and $L_{RX}$ can be sized to optimize the impedance matching in the TX and RX paths. Separate inductors $L_{TX}$ and $L_{RX}$, rather than a single inductor at the antenna 907, provide an additional design freedom to optimize the bandwidth and insertion loss in the TX and RX paths. Therefore, it is noted that, in one embodiment, there is no inductor at the antenna 907.

Co-Designed T/R Switch and PA output matching stage

Beneficially, because the inductors are separate, they can be co-designed separately with the transmit and receive circuit. For example, the transmit inductor $L_{TX}$ can be co-designed with the PA output matching network 404, while the $L_{RX}$ can be co-designed with the LNA 306.

Furthermore, the PA output matching network can be implemented using LC lumped elements, transformers, or transmission-line-based distributed components. To reduce chip area, the PA output matching network 404 uses a transformer-based matching network with two tuning capacitors, which only occupies a single inductor footprint.

Figure 6:
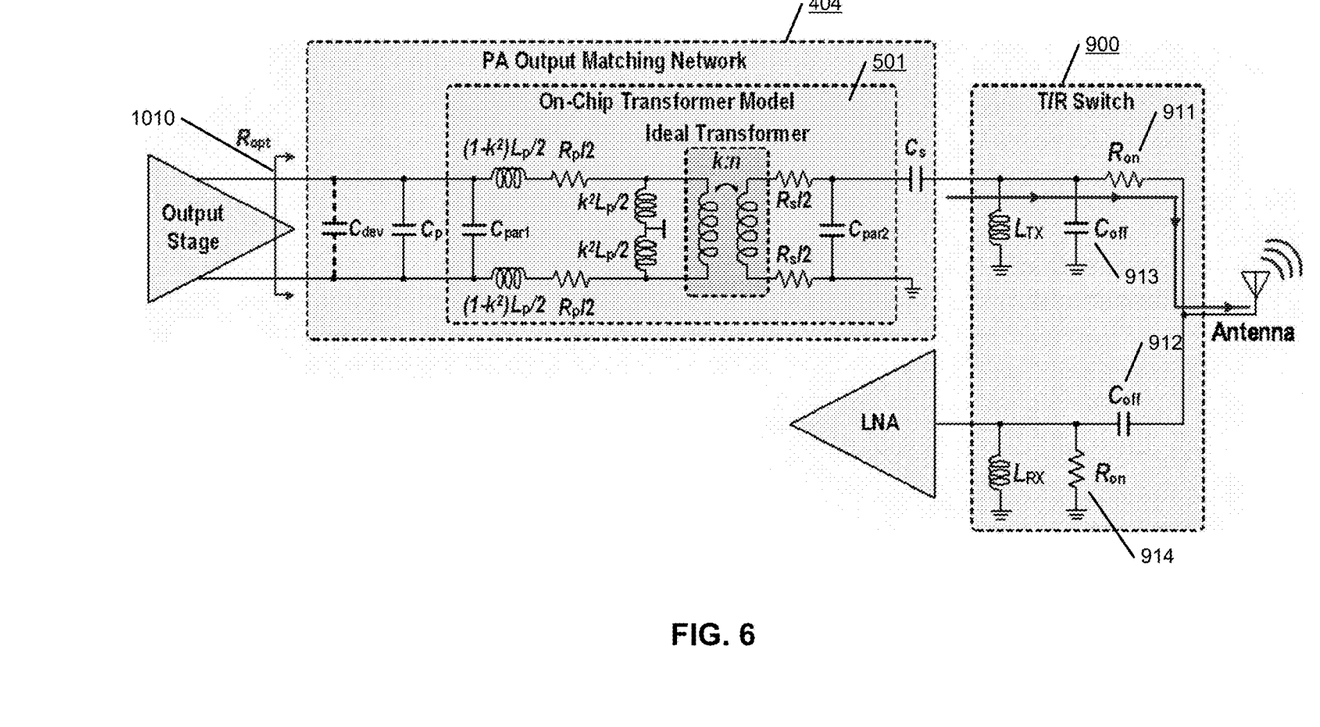
FIG. 6 shows a PA output matching network and a T/R switch according to one embodiment.

The lumped model equivalent circuit of the broadband output matching network is shown in FIG. 6. The PA output matching network 404 consists of an on-chip transformer 501, device parasitic capacitor $C_{dev}$, and two extra MOM capacitors $C_p$ and $C_s$. The physical transformer is modeled by an ideal transformer with its magnetizing inductor and leakage inductor, and its parasitic capacitors shunt to ground ($C_{par1}$ and $C_{par2}$). Here, k is the magnetic coupling coefficient, n is the turn radio, $L_p$ is primary self-inductance. $R_p$ and $R_s$, models the loss of the transformer.

For the T/R switch, $R_{on}$ 911, 914 models the on-resistance of the switch transistor and $C_{off}$ 913, 913 models the off-capacitance of the switch transistor.

A high-order passive network is formed to enable an instantaneously broad bandwidth. Thus, in a co-designed circuit, the value of each circuit element is chosen to achieve optimum load impedance seen by the PA output stage ($R_{opt}$) over the operation bandwidth while maintaining low insertion loss.

The gain of the PA output stage is defined as gm•|Z|•Loss, where gm is the transconductance of the transistor, Z is the load impedance presented to the PA output stage, and Loss is the passive loss of the output matching network. The goal of the broadband matching is to achieve relatively constant power gain across the operation frequency. Since gm is frequency independent, this transforms the design goal to achieve relatively constant |Z| and Loss over a broad bandwidth. In addition, PA transistors require real-value Z to achieve maximum output power and efficiency (load-pull condition), meaning that the real part of Z should be close to $R_{opt}$ 1010 with imaginary part close to 0 across the operation frequency.

If the PA output matching is designed for 50Ω antenna impedance without considering the effect from the T/R SW at the beginning, its in-band Z variation and Loss variation become larger after putting together with T/R SW in the systems integration. For example, the loss variation of the PA output matching network itself is 0.4 dB without adding the T/R SW and increases to 1.8 dB after integration with the T/R SW, as shown in FIG. 7, graph c.

Figure 7:
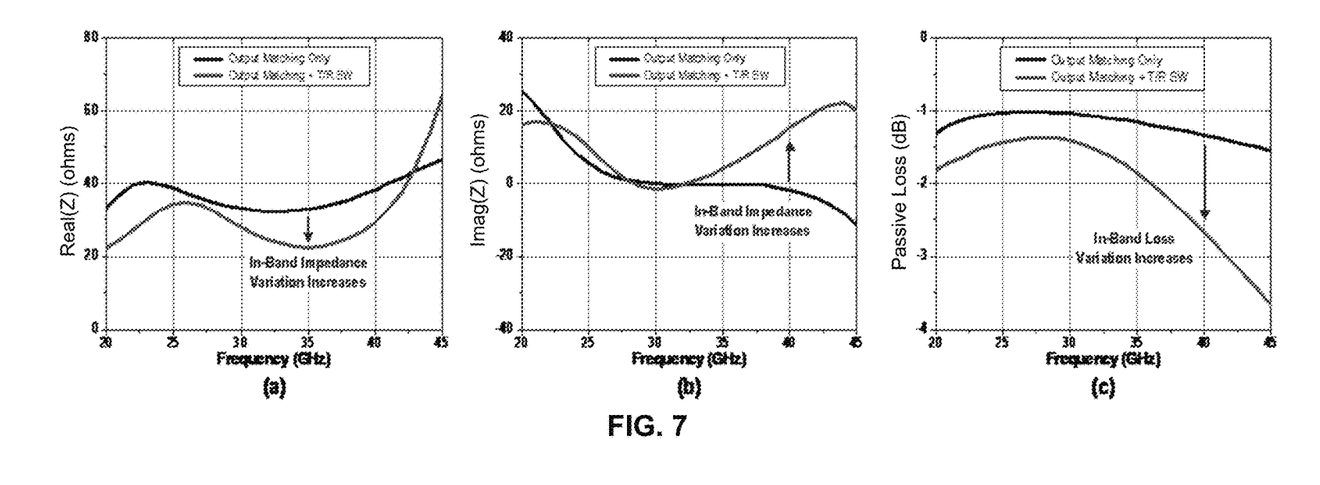
FIG. 7, graphs a-c show a comparison between an output matching circuit by itself and an output matching circuit connected to a T/R switch.

Indeed, FIG. 7, graphs a-c show simulated load impedance seen by the differential output stage and simulated passive loss. In this simulation, the PA output matching network is originally designed for 50Ω antenna impedance without considering the T/R SW. After adding the T/R SW, the in-band impedance variation and loss variation becomes larger.

Therefore, it is important to consider the parasitic capacitor (Coff) of the T/R Switch from the beginning and absorb it into the passive network synthesis by building a co-designed circuit, for example, by building a co-designed T/R switch and output matching circuit. The transformer parameters (k, n, and Lp), two tuning capacitors (Cp and Cs), and T/R SW TX-path inductor LTX are co-designed to achieve broadband matching.

Figure 8:
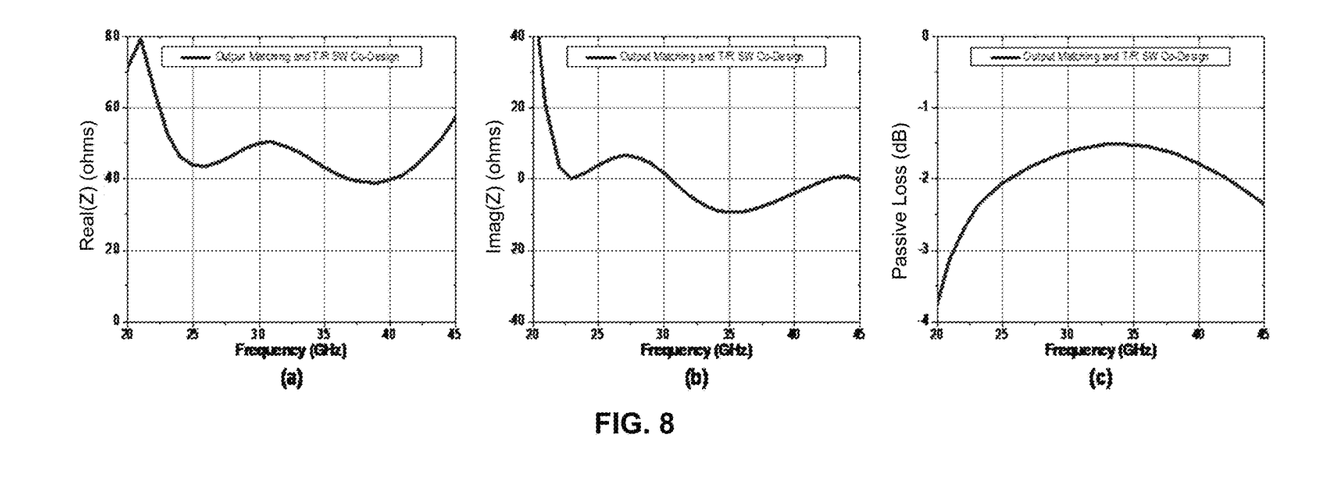
FIG. 8, graphs a-c show real impedance, imaginary impedance, and passive loss of a co-designed output matching circuit and T/R switch.

Referring now to FIG. 8, a simulated load impedance seen by the differential output stage and simulated passive loss by co-designing the PA output matching network with T/R SW is shown in graphs a-c. The co-designed output matching circuit and T/R switch has a real part of the load impedance close to 50Ω, and an imaginary part of the load impedance close to 0. The in-band passive loss variation is 0.8 dB.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

The invention claimed is:

1. An electronic circuit for wireless communication, comprising:
a transmit/receive (T/R) switch, the T/R switch including:
a transmit switch, between a transmit port and an antenna port;
a receive switch, between a receive port and the antenna port;
a transmit inductor, coupled in parallel between the transmit switch and the transmit port; and
a receive inductor, coupled in parallel between the receive switch and the receive port, wherein the transmit and receive switches each include two poles, wherein
in an "on" position
a first pole is closed, connecting a respective port to the antenna port,
a second pole is open, disconnecting a respective port to a common return, and
in an "off" position
the first pole is open, disconnecting the respective port from the antenna port, and
the second pole is closed, connecting the respective port to the common return.

2. The electronic circuit for wireless communication, of claim 1, wherein the transmit inductor has an inductance to resonate out a parasitic capacitance from the transmit switch and the receive inductor has an inductance to resonate out a parasitic capacitance of the receive switch.

3. The electronic circuit of claim 1, wherein the transmit and receive switches each include one or more field effect transistors.

4. An electronic circuit for wireless communication, comprising
a transmit/receive (T/R) switch, the T/R switch including:
a transmit switch, between a transmit port and an antenna port,
a receive switch, between a receive port and the antenna port,
a transmit inductor, coupled in parallel between the transmit switch and the transmit port, and
a receive inductor, coupled in parallel between the receive switch and the receive port;
a power amplifier (PA) output matching network having a first capacitor coupled, in parallel, to an input port of the matching network circuit;
a broadband on-chip transformer coupled, in parallel, to the first capacitor; and
a second capacitor coupled, in series, in between the broadband on-chip transformer and an output port of the matching network circuit, wherein the output port of the matching network circuit is coupled to the transmit port of the T/R switch.

5. The electronic circuit of claim 4, wherein a combination of the first capacitor, the on-chip transformer, the second capacitor of the matching circuit, and the transmit inductor and the receive inductor of the T/R switch, results in
a real impedance of the electronic circuit substantially equal to an optimal resistance $R_{OPT}$ at the input port of the PA output matching network,
an imaginary impedance of the circuit substantially equal to zero, and
a low insertion loss.

6. The electronic circuit of claim 4, wherein the T/R switch and the PA output matching network are a co-designed circuit, the first and second capacitors, transmit inductor, and transformer parameters, have a broadband impedance matched to
a load impedance of an antenna,
an on-resistance of the transmit switch, and
an off-capacitance of the transmit switch.

7. The electronic circuit of claim 4, wherein the PA output matching network and the T/R switch are an integrated circuit.

8. The electronic circuit of claim 4, wherein the transmit switch has an "on" state that connects the transmit port to an antenna, and an "off" state that disconnects the transmit port from the antenna.

9. The electronic circuit of claim 4, wherein the receive switch has an "on" state that connects the receive port to an antenna, and an "off" state that disconnects the receive port from the antenna.

10. The electronic circuit of claim 4, wherein the transmit and receive switches each include two poles, wherein
in an "on" position
a first pole is closed, connecting a respective port to the antenna port,
a second pole is open, disconnecting a respective port to a common return, and in an "off" position
the first pole is open, disconnecting the respective port from the antenna port, and
the second pole is closed, connecting the respective port to the common return.

11. A radio frequency (RF) front end circuit, comprising:
a transmit/receive (T/R) switch, the T/R switch including:
a transmit switch, between a transmit port and an antenna port;
a receive switch, between a receive port and the antenna port;
a transmit inductor, coupled in parallel between the transmit switch and the transmit port; and
a receive inductor, coupled in parallel between the receive switch and the receive port, wherein the transmit and receive switches each include two poles, wherein
in an "on" position
a first pole is closed, connecting a respective port to the antenna port,
a second pole is open, disconnecting a respective port to a common return, and
in an "off" position
the first pole is open, disconnecting the respective port from the antenna port, and
the second pole is closed, connecting the respective port to the common return.

12. The RF front end circuit of claim 11, wherein the transmit inductor has an inductance to resonate out a parasitic capacitance from the transmit switch and the receive inductor has an inductance to resonate out a parasitic capacitance of the receive switch.

13. The RF front end circuit of claim 11, wherein the transmit and receive switches each include one or more field effect transistors.

14. A radio frequency (RF) front end circuit, comprising
a transmit/receive (T/R) switch, the T/R switch including:
a transmit switch, between a transmit port and an antenna port,
a receive switch, between a receive port and the antenna port, a transmit inductor, coupled in parallel between the transmit switch and the transmit port, and a receive inductor, coupled in parallel between the receive switch and the receive port;

a power amplifier (PA) output matching network, having a first capacitor coupled, in parallel, to an input port of the matching network circuit;

a broadband on-chip transformer coupled, in parallel, to the first capacitor; and a second capacitor coupled, in series, in between the broadband on-chip transformer and an output port of the matching network circuit, wherein the output port of the matching network circuit is coupled to the transmit port of the T/R switch.

15. The RF front end circuit of claim 14, wherein a combination of the first capacitor, the on-chip transformer, the second capacitor of the matching circuit, and the transmit inductor and the receive inductor of the T/R switch, results in a real impedance of the electronic circuit substantially equal to an optimal resistance $R_{OPT}$ at the input port of the PA output matching network, an imaginary impedance of the circuit substantially equal to zero, and a low insertion loss.

16. The RF front end circuit of claim 14, wherein the T/R switch and the PA output matching network are a co-designed circuit, the first and second capacitors, transmit inductor, and transformer parameters, have a broadband impedance matched to a load impedance of an antenna, an on-resistance of the transmit switch, and an off-capacitance of the transmit switch.

17. The RF front end circuit of claim 14, wherein the PA output matching network and the T/R switch are an integrated circuit.

18. The RF front end circuit of claim 14, wherein the transmit switch has an "on" state that connects the transmit port to an antenna, and an "off" state that disconnects the transmit port from the antenna.

19. The RF front end circuit of claim 14, wherein the receive switch has an "on" state that connects the receive port to an antenna, and an "off" state that disconnects the receive port from the antenna.

20. The RF front end circuit of claim 14, wherein the transmit and receive switches each include two poles, wherein in an "on" position a first pole is closed, connecting a respective port to the antenna port, a second pole is open, disconnecting a respective port to a common return, and in an "off" position the first pole is open, disconnecting the respective port from the antenna port, and the second pole is closed, connecting the respective port to the common return.

* * * * *